United States Patent [19]
Kimura et al.

[11] Patent Number: 6,040,199
[45] Date of Patent: *Mar. 21, 2000

[54] SEMICONDUCTOR TEST STRUCTURE FOR ESTIMATING DEFECTS AT ISOLATION EDGE AND TEST METHOD USING THE SAME

[75] Inventors: Mikihiro Kimura; Masahiro Sekine, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,488

[22] Filed: Apr. 8, 1997

[30] Foreign Application Priority Data

Nov. 22, 1996 [JP] Japan ..................................... 8-311780

[51] Int. Cl.[7] .......................... G01R 31/26; H01L 21/66
[52] U.S. Cl. ............................................... 438/17; 438/18
[58] Field of Search ......................... 438/17, 18; 257/48; 324/765

[56] References Cited

U.S. PATENT DOCUMENTS

| | | |
|---|---|---|
| 3,983,479 | 9/1976 | Lee et al. . |
| 5,450,016 | 9/1995 | Masumori . |
| 5,567,553 | 10/1996 | Hsu et al. ................................... 430/5 |
| 5,598,102 | 1/1997 | Smayling et al. ........................ 324/537 |
| 5,638,006 | 6/1997 | Nariani et al. ........................... 324/765 |
| 5,648,275 | 7/1997 | Smayling et al. . |
| 5,801,538 | 9/1998 | Kwon ....................................... 438/18 |

FOREIGN PATENT DOCUMENTS

| | | |
|---|---|---|
| 0 113 087 | 7/1984 | European Pat. Off. . |
| 3-200348 | 9/1991 | Japan . |
| 6-112291 | 4/1994 | Japan . |

OTHER PUBLICATIONS

Kimura et al., Generation Current Reduction at Local Oxidation of Silicon Isolation Edge by Low–Temperature Hydrogen Annealing, Japanese Journal of Applied Physics, vol.30, No. 12B, pp. 3634–3637, Dec. 1991.

IEEE 1986 Symp. VLSI Tech. Digest of Technical Papers, pp. 31–32, 1986, S. Ohya, et al., "A New Bird's Beak Free Isolation Technology".

Extended Abstracts of the 1995 International Conference on Solid State Devices and Materials, pp. 590–592, 1995, B.H. Roh, et al., "Highly Manufacturable Shallow Trench Isolation For Giga Bit DRAM".

Japanese Journal of Applied Physics, vol. 30, No. 12B, pp. 3634–3637, Dec. 1991, M. Kimura, et al., "Generation Current Reduction at Local Oxidation of Silicon Isolation Edge by Low–Temperature Hydrogen Annealing".

P.L. Garbarino, et al., Journ. Electrochem. Soc., vol. 720, pp. 834–835, "Nondestructive Location of Oxide Breakdowns on MOSFET Structures", 1973.

*Primary Examiner*—Brian Dutton
*Attorney, Agent, or Firm*—Oblon, Spivak, McClelland, Maier & Neustadt, P.C.

[57] ABSTRACT

An Al pad (11) is provided on a field oxide film isolation (5). The Al pad (11) is electrically connected to a gate electrode (7) with an Al wiring pattern (10) and the like. In measurement, a probe (3) comes into contact with the Al pad (11) to apply a voltage thereto. The probe (3) does not come into direct contact with the gate electrode (7), and therefore no stress is applied to a region below a gate insulation film (6) in which a depletion layer is to be created. With this structure, more accurate result is obtained in a test of estimating defects at an isolation edge using a C-t measurement method.

4 Claims, 10 Drawing Sheets

FIG. 11  *BACKGROUND ART*
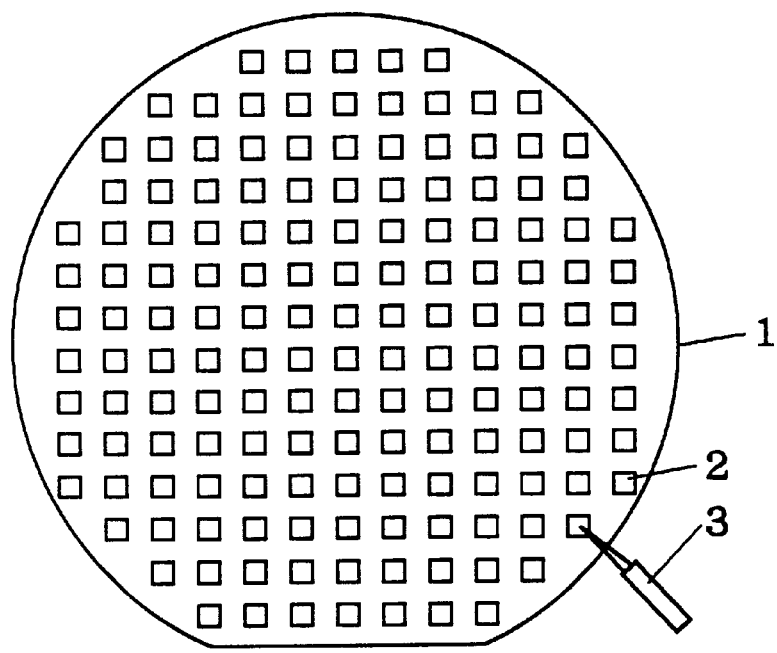
FIG. 12  *BACKGROUND ART*
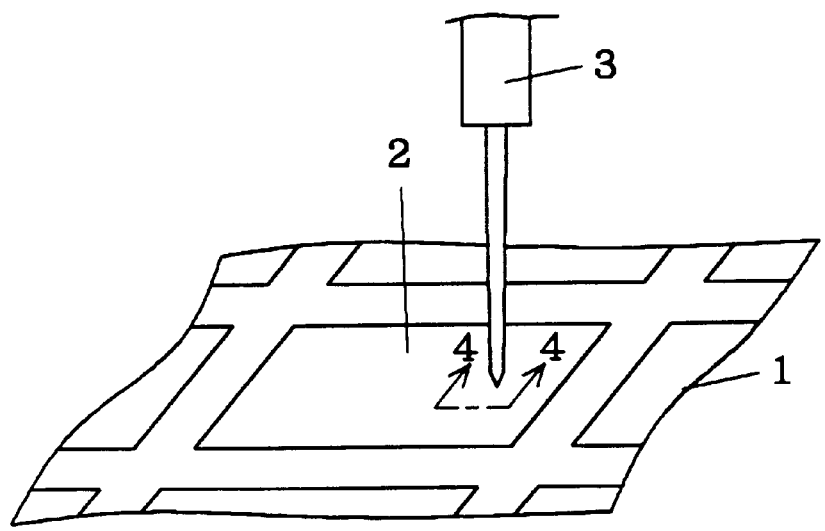

SEMICONDUCTOR TEST STRUCTURE FOR ESTIMATING DEFECTS AT ISOLATION EDGE AND TEST METHOD USING THE SAME

BACKGROUND OF THE INVENTION

1. Field of the Invention

The present invention relates to a test structure and a test method for estimating defects at an isolation edge utilizing a C-t (Capacitance-time) measurement method to evaluate an isolation structure in a semiconductor device which is increasingly becoming highly-integrated.

2. Description of the Background Art

In a field of a semiconductor device which is increasingly becoming highly-integrated, development of an isolation structure is critical to an improvement in device integration. The isolation structure refers to a structure for isolating elements which constitute a semiconductor integrated circuit on a semiconductor chip from one another. FIG. 11 is a plan view showing a relation of a wafer, semiconductor chips and a probe. A semiconductor chip 2 is disposed on a wafer 1, and a probe 3 comes into contact with the semiconductor chip 2 to apply a voltage thereto in order to evaluate the isolation structure provided on the semiconductor chip 2.

FIG. 12 is an enlarged perspective view showing a portion where the probe 3 is in contact with the semiconductor chip 2 on the wafer 1. The probe 3 is pressed against a main surface of the wafer 1 almost perpendicularly thereto so as to apply a pressure to the main surface of the wafer 1 inwardly.

FIG. 13 is a cross section taken along the line 13—13 of FIG. 12 observed from the direction of the arrows. In FIG. 13, a field oxide film isolation 5 is provided on the main surface of the wafer 1 to isolate the semiconductor elements from one another and a gate insulation film 6 is contiguous with the field oxide film isolation on the main surface of the wafer 1, being thinner than the field oxide film isolation 5. A gate electrode 7 is disposed on the gate insulation film 6, extending onto portions of the field oxide film isolation 5 near the gate insulation film 6. A depletion layer 8 is created between the wafer 1 and the gate electrode 7 by applying a voltage with the probe 3.

One of process steps of a test for estimating defects at the isolation edge is shown in FIG. 13. For example, evaluation of the isolation structure is implemented by measuring a current which appears at the periphery of a LOCOS edge as described in Japanese Journal of Applied Physics Vol. 30, No. 128, December, 1991, pp. 3634–3637, "Generation Current Reduction at Local Oxidation of Silicon Isolation Edge by Low-Temperature Hydrogen Annealing" by Mikihiro Kimura, Kaoru Motonami and Yasuhiro Onodera.

Specifically describing, oxide capacitance Co is first measured, which is capacitance of a capacitor constituted of the oxide film (gate insulation film) 6 and the gate electrode 7 in a state where no depletion layer is created by a high-frequency signal. Second, the depletion layer 8 is created by applying a step voltage with the high-frequency signal superimposed thereon, and then initial capacitance $C_i$ in this state is measured. Finally, after a time $t_F$, when the capacitance comes into equilibrium, equilibrium capacitance $C_F$ is measured. A relation between the capacitance and the time in this measurement is shown in FIG. 14.

According to Shroeder and Guldberg's approximation, a lifetime $\tau_{gm}$ is obtained from Eq.(1) as below:

$$\tau_{gm} = \frac{n_i}{8N_B} \cdot \frac{C_F}{C_0} \cdot t_F \left(1 + \frac{C_i}{C_F}\right)^2 \quad (1)$$

where $n_i$ and $N_B$ represent intrinsic carrier concentration and substrate impurity concentration, respectively.

A generation current $J_{gen}$ is derived from the lifetime $\tau_{gm}$ as expressed in Eq.(2):

$$J_{gen} = q n_i W_{eff} / \tau_{gm} \quad (2)$$

where $W_{eff}$ and q represent an effective depletion-layer width and the amount of electric charges, respectively.

As can be seen from FIG. 15, the generation current $J_{gen}$ includes an inplane component and a peripheral component, that is, inplane generation current $J_{genA}$ and the generation current at the LOCOS edge $J_{genP}$. The generation current $J_{gen}$ is expressed using the inplane generation current $J_{genA}$ and the generation current at LOCOS edge $J_{genP}$ as follows:

$$J_{gen} = J_{genP} \cdot \frac{P}{A} + J_{genA} \quad (3)$$

In order to conduct a test of evaluating the isolation structure, it is necessary to extract only the generation current at LOCOS edge $J_{genP}$, for example. With variation of area and peripheral length of the LOCOS edge, a graph is made as shown in FIG. 15 using several points of measurement, and the generation current $J_{genP}$ per unit length is obtained from the slope of the graph. If only the generation current at LOCOS edge $J_{genP}$ per unit length becomes larger, more defects are found at the LOCOS edge.

In the background-art test structure for estimating defects at isolation edge, a stress is applied to a region where a depletion layer is to be created below the gate electrode 7 since the probe 3 comes into direct contact with the gate electrode 7 which is provided on a region to be evaluated, as shown in FIG. 13, and a recombination center is thereby additionally created. Thus, there arises a problem that the measured value has more errors than a value to be obtained in a measurement under the condition of actual use.

SUMMARY OF THE INVENTION

The present invention is directed to a semiconductor test structure for estimating defects at an isolation edge. According to a first aspect of the present invention, the semiconductor test structure comprises: a first insulation film provided on a main surface of a semiconductor substrate on which a plurality of semiconductor elements can be provided, having enough width to isolate the plurality of semiconductor elements from one another; a second insulation film provided on the main surface, being contiguous with the first insulation film and thinner than the first insulation film; an electrode disposed on the second insulation film, extending onto portions of the first insulation film; and a pad provided on the first insulation film and electrically connected to the electrode, with which a probe comes into contact. In the semiconductor test structure of the first aspect, no depletion layer is created in a portion of the semiconductor substrate which constitute a multilayered structure together with the electrode and the second insulation film when no voltage is applied across the semiconductor substrate and the pad, and a depletion layer is created in the portion of the semiconductor substrate of the multilayered structure and extends to a portion below an interface between the first insulation film and the second insulation film and the vicinity of the portion when a predetermined level voltage is applied across the semiconductor substrate and the pad.

According to a second aspect of the present invention, in the semiconductor test structure of the first aspect, the second insulation film below the electrode includes a plurality of regions which are independent of one another.

According to a third aspect of the present invention, in the semiconductor test structure of the first aspect, the second insulation film below the electrode includes a region whose plane at the main surface is of S-shaped.

According to a fourth aspect of the present invention, in the semiconductor test structure of the first aspect, the second insulation film below the electrode includes a plurality of regions whose plane surfaces at the main surface have different peripheral lengths at interface with the first insulation film and the same area, the electrode includes a plurality of electrodes provided correspondingly to the plurality of regions of the second insulation film and electrically isolated from one another, and the pad includes a plurality of pads provided correspondingly to the plurality of electrodes.

According to a fifth aspect of the present invention, the semiconductor test structure of the first aspect further comprises: connecting means provided near the electrode and electrically connected to the main surface of the semiconductor substrate. In the semiconductor test structure of the fifth aspect, the voltage is applied through the connecting means across the pad and the semiconductor substrate.

The present invention is also directed to a method of estimating defects using a semiconductor test structure for estimating defects at an isolation edge. According to a sixth aspect of the present invention, the method comprises the steps of: preparing a semiconductor substrate on which a plurality of semiconductor elements can be provided and which is provided with a first insulation film on a main surface thereof, having enough width to isolate the plurality of semiconductor elements from one another, a second insulation film on the main surface, being contiguous with the first insulation film and thinner than the first insulation film, an electrode disposed on the second insulation film, extending onto portions of the first insulation film, and a pad disposed on the first insulation film and electrically connected to the electrode; creating a depletion layer through applying a prescribed voltage across the electrode and the semiconductor substrate with a probe put into contact with the pad so that the depletion layer may extend to a portion below an interface between the first and second insulation films and the vicinity of the portion; and measuring time from when the depletion layer is created to when capacitance comes into equilibrium.

According to a seventh aspect of the present invention, in the method of the sixth aspect, the second insulation film below the electrode includes a plurality of regions whose plane surfaces at the main surface have different peripheral lengths at interface with the first insulation film and the same area, the electrode includes a plurality of electrodes provided correspondingly to the plurality of regions of the second insulation film and electrically isolated from one another, and the pad includes a plurality of pads provided correspondingly to the plurality of electrodes. Further, in the method of the seventh aspect, a plurality of data of different parameters can be recorded by one measurement with a plurality of probes put into contact with the plurality of pads in the step of measuring time.

In the semiconductor test structure for estimating defects at the isolation edge of the first aspect, the voltage is applied by putting the probe into contact with the pad when a test is conducted. When the C-t measurement method is adopted for evaluation, less stress is applied to the semiconductor region to be evaluated below the second insulation film and the interface between the first and second insulation films and its vicinity. That produces an effect of more accurate evaluation.

In the semiconductor test structure of the second aspect, the second insulation film below the electrode is divided into a plurality of regions to increase the periphery-to-area ratio of the isolation edge to be evaluated. When the C-t measurement method is adopted for evaluation, the generation current according to the area decreases and the generation current at the isolation edge increases. That produces an effect of more accurate measurement.

In the semiconductor test structure of the third aspect, the second insulation film below the electrode has a plane of S-shaped to increase the peripheral length at the interface. When the C-t measurement method is adopted for evaluation, the generation current at the isolation edge increases. That produces an effect of more accurate measurement.

In the semiconductor test structure of the fourth aspect, the plurality of regions of the second insulation film are measured using the C-t measurement method. As a result, respective data are separately obtained from the regions. With these data of different parameters on the peripheral length at the interface, it is possible to obtain information on the generation current at the interface between the first and second insulation films as divided data. Therefore, performing simultaneous measurements on these regions results in reduction in the number measurements.

In the semiconductor test structure of the fifth aspect, the voltage is applied through the connecting means provided near the electrode. That makes the potential distribution in the semiconductor substrate uniform and improves the accuracy of measurement.

In the method of estimating defects using the semiconductor test structure of the sixth aspect, the probe comes into contact with the pad rather than direct contact with the electrode, to thereby reduce the stress applied to the semiconductor region to be evaluated below the second insulation film and the interface between the first and second insulation films and its vicinity. That produces an effect of more accurate evaluation.

In the method of the seventh aspect, a plurality of data of different parameters can be recorded by one measurement with a plurality of probes. Therefore, the number of measurements is advantageously reduced.

An object of the present invention is to reduce the pressure applied on a region where a depletion layer is to be created, for higher accuracy of measurement.

Another object of the present inventions to increase the peripheral length of isolation edge, for higher precision of measurement.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a plan view showing a conventional relation between a wafer and a probe;

FIG. 12 is an enlarged perspective view of a conventional semiconductor chip with which the probe is in contact on the wafer of FIG. 11;

DESCRIPTION OF THE PREFERRED EMBODIMENTS

The First Preferred Embodiment.

Figure 1:
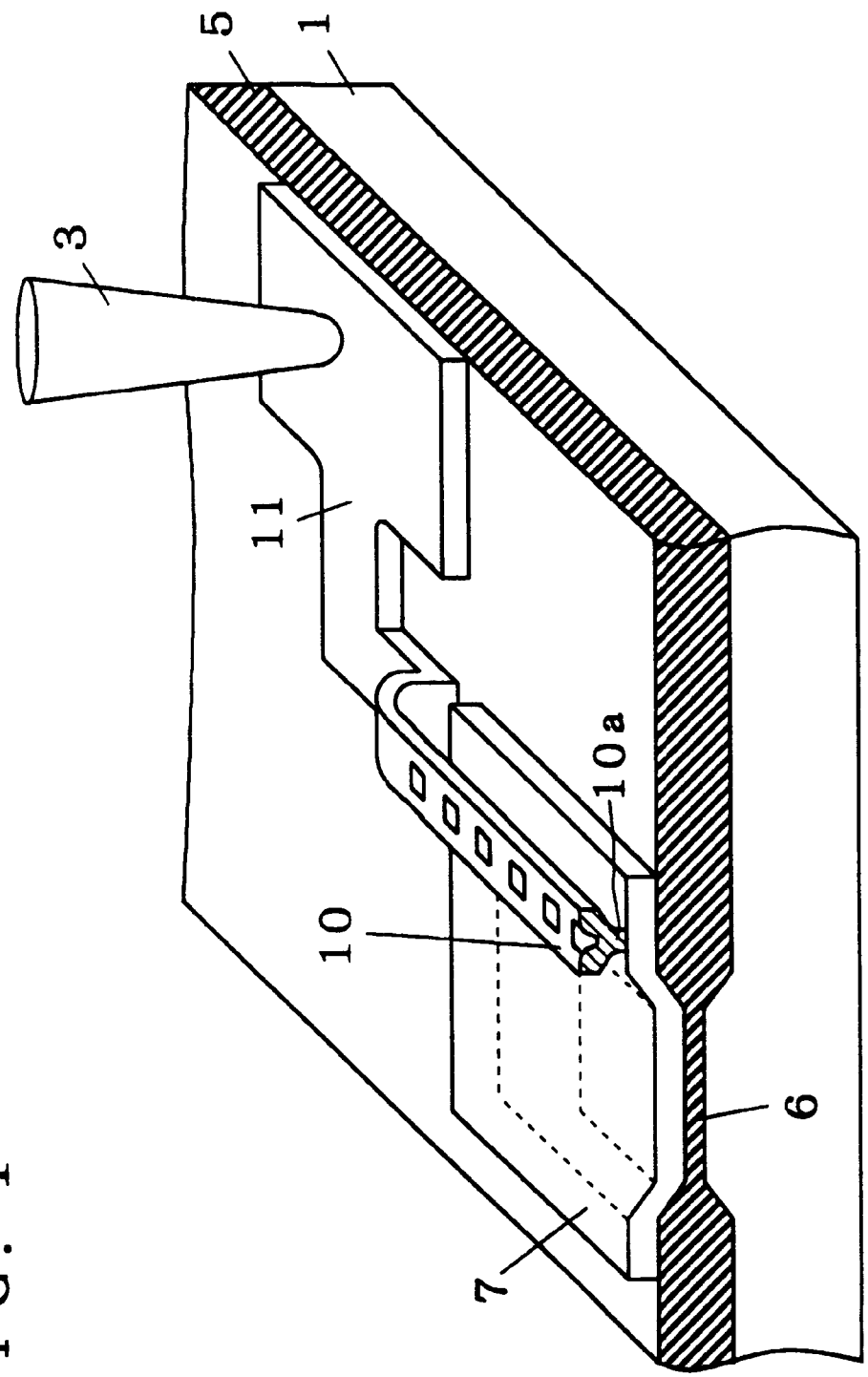
FIG. 1 is a perspective section showing a test structure for estimating defects at isolation edge in accordance with a first preferred embodiment of the present invention.

FIG. 1 is a perspective section showing a test structure for estimating defects at isolation edge in accordance with the first preferred embodiment of the present invention.

The wafer 1 is made of single crystalline silicon. The field oxide film isolation 5 is provided on the main surface of the wafer 1 to isolate the semiconductor elements on the main surface of the wafer 1 from one another and the gate insulation film 6 is contiguous with the field oxide film isolation 5 on the wafer 1, being thinner than the field oxide film isolation 5. The gate electrode 7 is made of polysilicon and provided on the gate insulation film 6, extending onto portions of the field oxide film isolation 5 near the gate insulation film 6. An Al wiring pattern 10 is provided above the field oxide film isolation 5 and electrically connected to the gate electrode 7 and an Al contact 10a serves to connect the Al wiring pattern 10 to the gate electrode 7. An Al pad 11 is provided on the field oxide film isolation 5 and electrically connected to the Al wiring pattern 10. The isolation edge refers to an interface between the field oxide film isolation 5 and the gate insulation film 6. The field oxide film isolation 5 and the gate insulation film 6 are made of silicon oxide, such as oxidized wafer 1. The gate insulation film 6, the gate electrode 7 and the wafer 1 below the gate insulation film 6 are layered to form a MIS structure.

Figure 13:
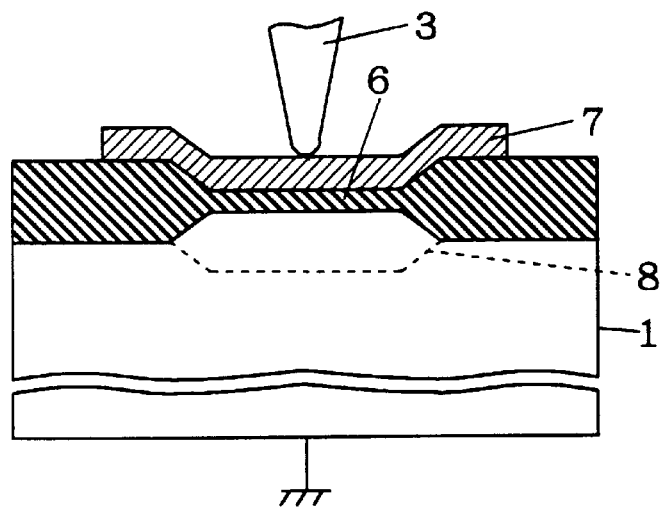
FIG. 13 is a cross section taken along the line 13—13 of FIG. 12 observed from the direction of the arrows.
Figure 14:
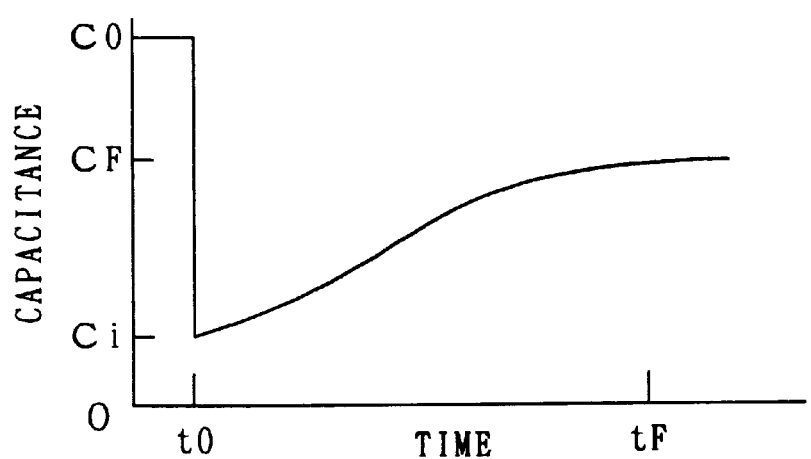
FIG. 14 is a graph showing a conventional overview of a relation between capacitance and time in the C-t measurement.

With no voltage across the Al pad 11 and the wafer 1, no depletion layer is created in the wafer 1 immediately below the gate insulation film 6 in the multilayered structure. With a predetermined voltage level being applied across the Al pad 11 and the wafer 1, a depletion layer is created in the wafer 1 immediately below the gate insulation film 6 in the multilayered structure and extends to the wafer 1 below the interface between the field oxide film isolation 5 and the gate insulation film 6 and the vicinity, like in FIG. 13.

The probe 3 comes into contact with the Al pad 11 to apply a voltage across the gate electrode 7 and the wafer 1. Since the Al pad 11 is provided on the field oxide film isolation 5, a stress which is applied to a region where the depletion layer is to be created in the wafer 1 below the gate insulation film 6 is reduced though the probe 3 applies a pressure to the Al pad 11. Thus, the recombination center and the like produced due to the stress, which might cause an error, are reduced. That eliminates the difference between the conditions of actual use and measurement and improves the accuracy of measured value.

Though the impurity concentration of the wafer 1 below the gate insulation film 6 does not vary in the first preferred embodiment, the impurity concentration may vary, for example, through formation of a well, and the same effect as above can be attained.

Figure 2:
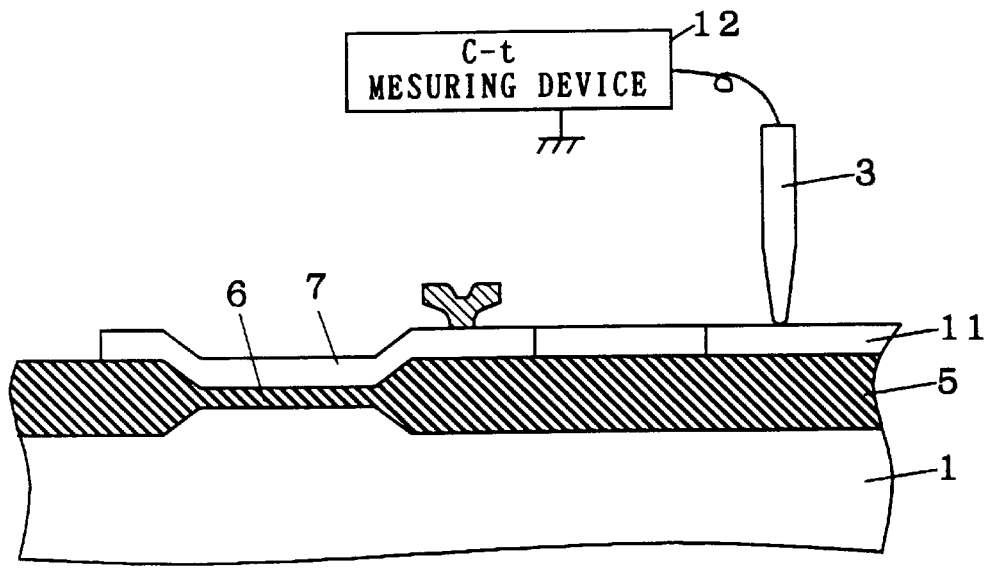
FIG. 2 is a block diagram showing connection of a C-t measuring device to the test structure for estimating defects at isolation edge in accordance with the first preferred embodiment of the present invention.

FIG. 2 is a block diagram showing connection of a C-t measuring device to the test structure for estimating defects at isolation edge. The test structure for estimating defects at isolation edge in which the Al pad 11 provided on the field oxide film isolation 5 is connected to the gate electrode 7, as shown in FIG. 1, is prepared. The probe 3 of a C-t measuring device 12 is held in contact with the Al pad 11. With no depletion layer below the gate insulation film 6, the C-t measuring device 12 measures capacitance of a capacitor constituted of the gate insulation film 6, the gate electrode 7 and the wafer 1 with a high-frequency signal applied to the gate electrode 7. The capacitance corresponds to the oxide capacitance $C_o$ in Eq.(1).

Next, the C-t measuring device 12 instantaneously produces a deep depletion layer by applying the step voltage with the high-frequency signal superimposed thereon and then measures the initial capacitance $C_i$. Further, after the time $t_F$, the C-t measuring device 12 measures the equilibrium capacitance $C_F$ when the capacitance comes into equilibrium.

In order to obtain the generation current $J_{genP}$ at the isolation edge, it is necessary to perform more than one measurement with variation of parameter. Therefore, it is effective to connect a data recorder 13 to the C-t measuring device 12, as shown in FIG. 3, so as to record information given by the C-t measuring device 12.

Figure 3:
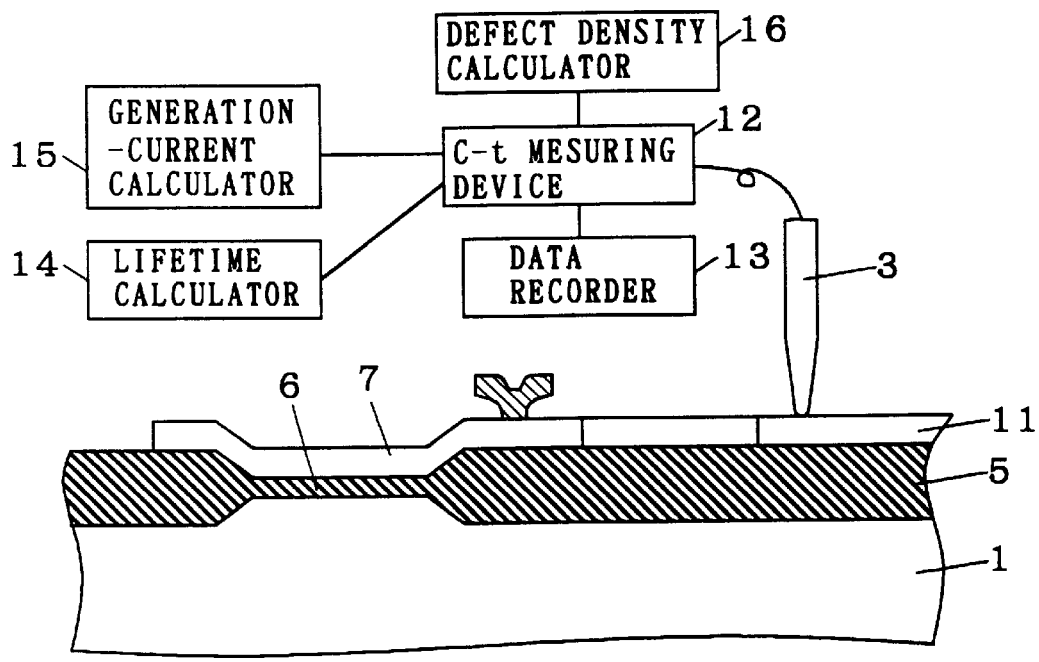
FIG. 3 is a block diagram showing a system configuration in which various functions are provided additionally to the C-t measuring device of FIG. 2.

A lifetime calculator 14 of FIG. 3 calculates the lifetime based on the information outputted from the C-t measuring device 12. The information recorded in the data recorder 13 may be used instead of that from the C-t measuring device 12. The lifetime calculator 14 is given beforehand values of the intrinsic carrier concentration $n_i$ and the substrate impurity concentration $N_B$ on the isolation edge to be measured, to calculate the lifetime $\tau_{gm}$ according to Eq.(1).

Figure 15:
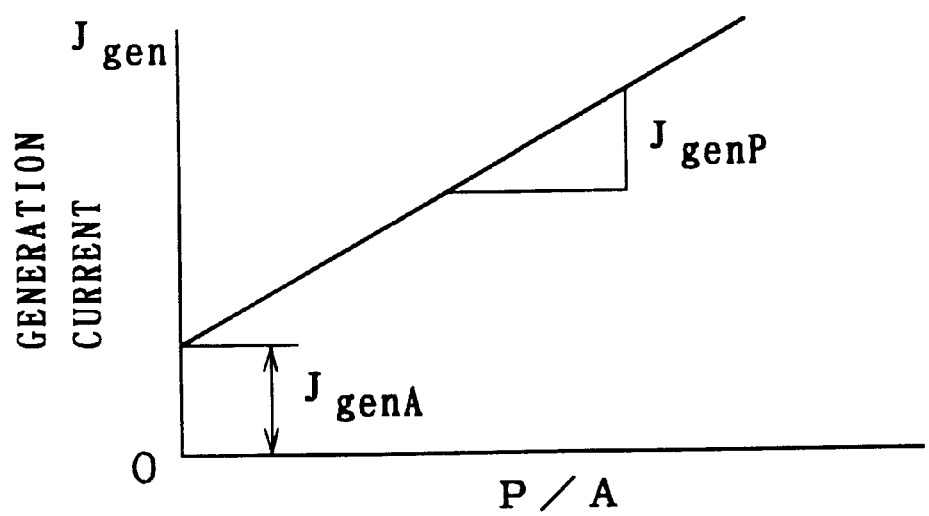
FIG. 15 is a graph showing a conventional relation between a periphery-to-area ratio of a region where a depletion layer is to be created and a generation current.

A generation-current calculator 15 of FIG. 3 calculates the generation current based on the information outputted from the C-t measuring device 12. The information recorded in the data recorder 13 or outputted from the lifetime calculator 14 may be used instead of that from the C-t measuring device 12. The generation-current calculator 15 is given beforehand the effective depletion-layer width $W_{\it eff}$ and the amount of electric charges q on the isolation edge to be measured, to calculate the generation current $J_{gen}$ according to Eq.(2). Further, the generation-current calculator 15 is given beforehand the data on planes of the gate insulation film 6 to obtain a plurality of generation currents $J_{gen}$ and calculates the generation current $J_{genP}$ at the isolation edge from the slope of the line in such a graph as shown in FIG. 15.

A defect-density calculator 16 of FIG. 3 calculates the defect density based on the information outputted from the C-t measuring device 12. Calculation of the defect density is implemented according to Eq.(4) as below, for example:

$$N_T = \frac{1}{\sigma_T v_{en} \tau_{gm}} \quad (4)$$

where $\sigma_T v_{en}$ represent the area of capture cross section and thermal velocity, respectively. The lifetime $\tau_{gm}$ of Eq.(4) may be given from the lifetime calculator 14.

Figure 4:
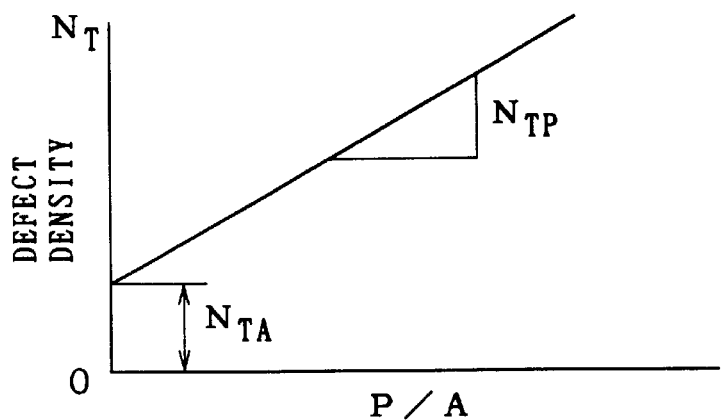
FIG. 4 is a graph showing a relation between a periphery-to-area ratio of a region where a depletion layer is to be created and a defect density.

As shown in FIG. 4, the defect density $N_T$ includes an inplane defect density $N_{TA}$ in a plane immediately below the gate insulation film 6 and a defect density $N_{TP}$ in a portion immediately below the edge of the field oxide film isolation 5, and therefore the defect-density calculator 16 calculates the defect density $N_{TP}$ in the portion immediately below the edge from a plurality of data.

The Second Preferred Embodiment.

Figure 5:
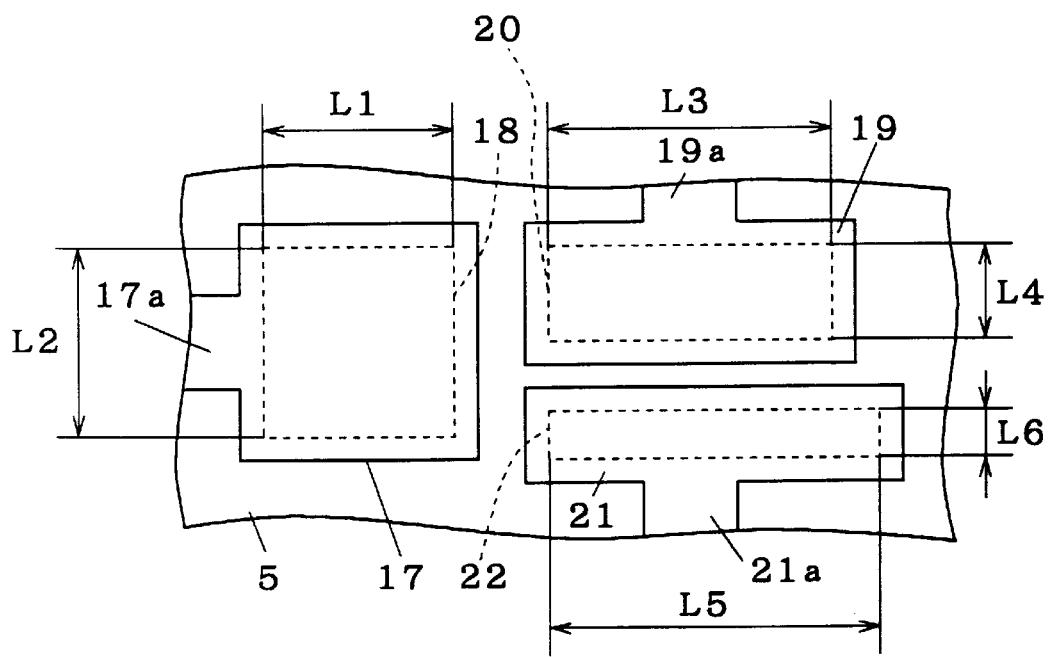
FIG. 5 illustrates a layout of a test structure for estimating defects at isolation edge in accordance with a second preferred embodiment of the present invention.

Referring next to FIG. 5, the test structure for estimating defects at the isolation edge in accordance with the second preferred embodiment of the present invention will be discussed. FIG. 5 illustrates a layout of the test structure for estimating defects at isolation edge in accordance with the second preferred embodiment of the present invention. A gate electrode 17 is provided on the field oxide film isolation 5 and gate electrodes 19 and 21 are also provided on the field oxide film isolation 5 and electrically isolated from each other and the gate electrode 17. Regions 18, 20 and 22 of the oxide film (gate insulation film 6) are located below the gate electrodes 17, 19 and 21, respectively, which are each contiguous with the field oxide film isolation 5 and thinner than the field oxide film isolation 5. Below the field oxide film isolation 5 and the gate insulation film 6 exists the wafer 1 like in FIG. 1.

The regions 18, 20 and 22 of the gate insulation film 6 are rectangular planes having lengths L1, L3 and L5 and breadth L2, L4 and L6, respectively. Assuming that L1 is 4, L2 to L6 are determined as 4, 6, 2, 7 and 1, respectively.

Accordingly, the peripheral lengths of the regions 18, 20 and 22 are equal. On the other hand, the areas of the regions 18, 20 and 22 are different, being 16, 12 and 7, respectively.

An extension 17a of the gate electrode 17 is connected to an Al pad not shown like the Al pad 11 of FIG. 1. An extension 19a of the gate electrode 19 is connected to an Al pad not shown other than that connected to the gate electrode 17. An extension 21a of the gate electrode 21 is connected to an Al pad not shown other than that connected to the gate electrode 17 or 19. These Al pads are naturally provided on the field oxide film isolation 5.

By simultaneously measuring the generation currents $J_{gen}$ at the regions 18, and 22, three kinds of data of different parameters can be obtained at a time. From these data, the generation current $J_{genP}$ at the field oxide film isolation edge can be obtained. Thus, the number of measurements is reduced.

Figure 6:
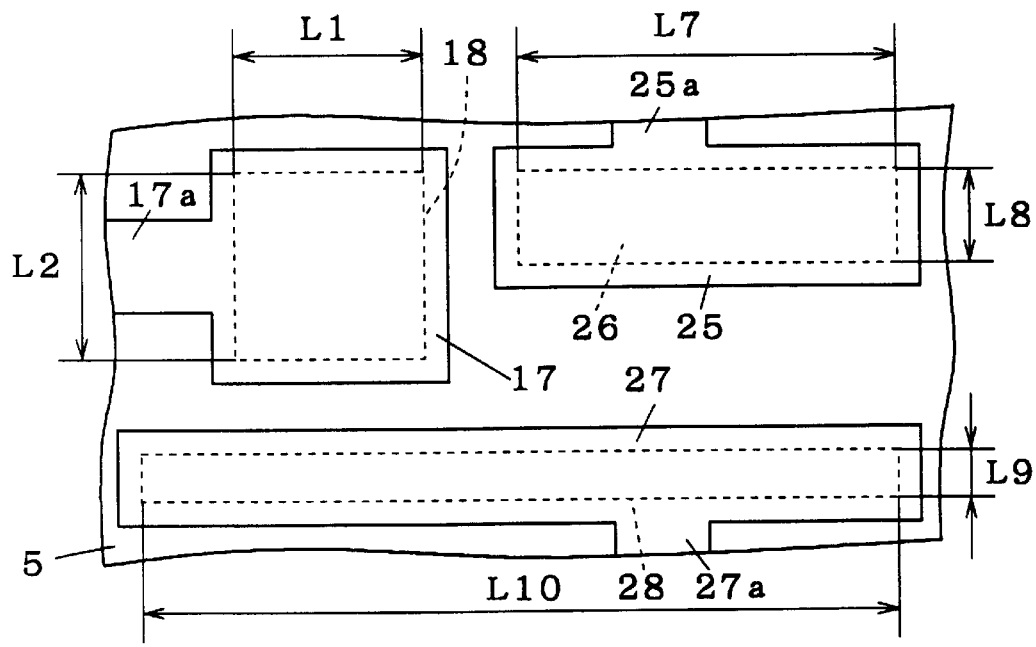
FIG. 6 illustrates a layout of a test structure for estimating defects at isolation edge in accordance with another aspect of the second preferred embodiment of the present invention.

FIG. 6 illustrates a layout of a test structure for estimating defects at isolation edge in accordance with another aspect of the second preferred embodiment of the present invention. Gate electrodes 25 and 27 are also provided on the field oxide film isolation 5 and electrically isolated from each other and the gate electrode 17. Regions 26 and 28 of the oxide film (gate insulation film 6) are located below the gate electrodes 25 and 27, respectively, which are each contiguous with the field oxide film isolation 5 and thinner than the field oxide film isolation 5. Other than the above, like elements of FIG. 6 are given the same reference signs as those of FIG. 5. Furthermore, for example, one of elements which are isolated with the field oxide film isolation 5 is a MIS transistor.

The regions 26 and 28 of the gate insulation film 6 are rectangular planes having lengths L7 and L9 and breadths L8 and L10, respectively. Assuming that L1 is 4, L2 and L7 to L10 are determined as 4, 8, 2, 1 and 16, respectively.

Accordingly, the areas of the regions 18, 26 and 28 are equal. On the other hand, the peripheral lengths of the regions 18, 26 and 28 are different, being 16, 20 and 34, respectively.

An extension 25a of the gate electrode 25 is connected to an Al pad not shown other than that connected to the gate electrode 17. An extension 27a of the gate electrode 27 is connected to an Al pad not shown other than that connected to the gate electrode 17 or 25.

By simultaneously measuring the generation currents $J_{gen}$ at the regions 18, 26 and 28, three kinds of data of different parameters can be obtained at a time. From these data, the inplane generation current $J_{genA}$ can be obtained. The generation current $J_{genP}$ at the field oxide film isolation edge can be indirectly obtained from the inplane generation current $J_{genA}$, and thus the number of measurements is reduced.

Though the regions of the gate insulation film 6 in the second preferred embodiment each have a rectangular plane, the regions may each have a plane of different shape and produces the same effect as those of the second preferred embodiment.

The Third Preferred Embodiment.

Figure 7:
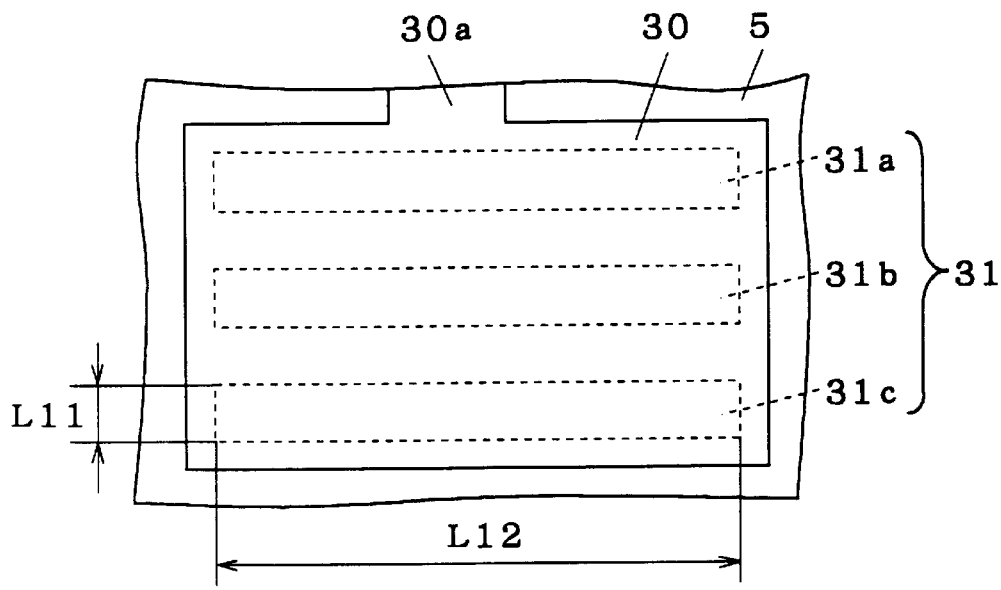
FIG. 7 illustrates a layout of a test structure for estimating defects at isolation edge in accordance with a third preferred embodiment of the present invention.

Referring next to FIG. 7, the test structure for estimating defects at the isolation edge in accordance with the third preferred embodiment of the present invention will be discussed. FIG. 7 illustrates a layout of a test structure for estimating defects at isolation edge in accordance with the third preferred embodiment of the present invention. A gate electrode 30 is provided on the field oxide film isolation 5 and a gate insulation film 31 to be evaluated includes rectangular regions of oxide film 31a to 31c each having breadth L11 and length L12, each of which is contiguous with the field oxide film isolation 5 and thinner than the field oxide film isolation 5. An extension 30a of the gate electrode 30 is connected to an Al pad provided on the field oxide film isolation 5 and not shown, with which the probe comes into electric contact. Below the field oxide film isolation 5 and the gate insulation film 31 exists the wafer 1 like in FIG. 1.

Given improvement in accuracy of measurement by virtue of the test structure for estimating defects at the isolation edge of the first preferred embodiment, errors of measurement due to other factors become conspicuous. In the test structure for estimating defects at the isolation edge of the third preferred embodiment, the peripheral length of the isolation edge is elongated to increase the generation current at the isolation edge as compared with the inplane generation current, thereby improving the precision of estimate.

In this example, the gate insulation film 31 to be evaluated is divided into a plurality of regions 31a to 31c which are substantially parallel with one another as shown in FIG. 7 to increase the periphery-to-area ratio of the gate insulation film 31, thereby improving the precision of estimate.

Figure 8:
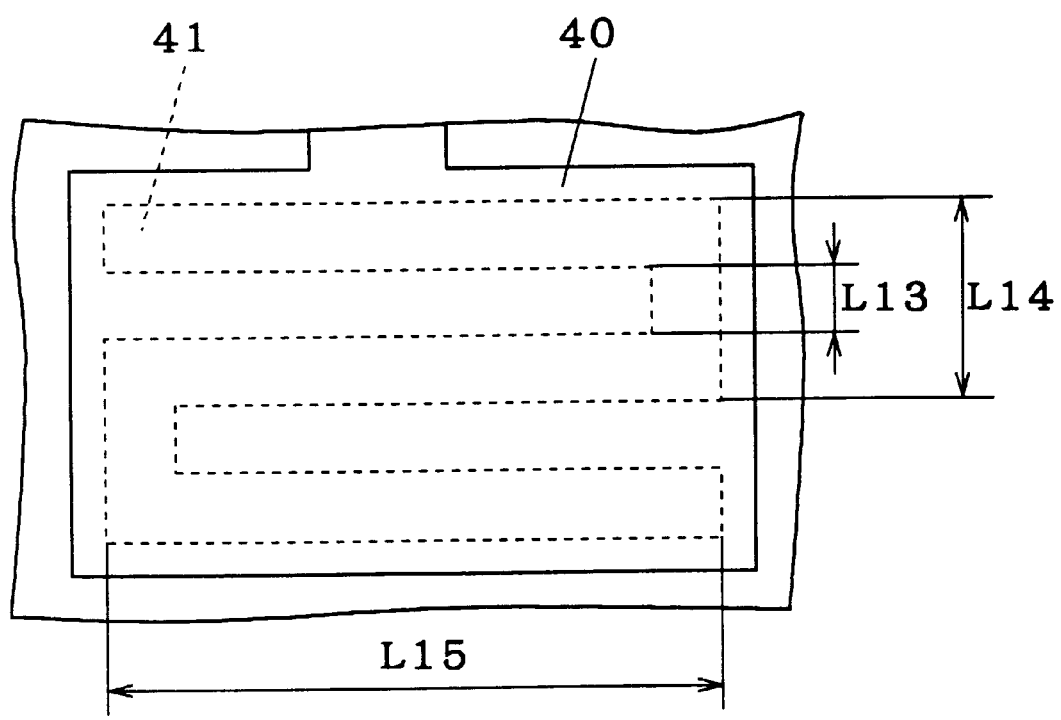
FIG. 8 illustrates a layout of a test structure for estimating defects at isolation edge in accordance with another aspect of the third preferred embodiment of the present invention.

Furthermore, as shown in FIG. 8, a gate insulation film 41 of S-shaped is provided below a gate electrode 40, to produce the same effect as dividing the gate insulation film into a plurality of regions. If length L15 is equal to L12 and the breadth (L14–L13)/2 is equal to L11, this case has an advantage in precision of estimate by two regions having the breadth L13.

The Fourth Preferred Embodiment.

Figure 9:
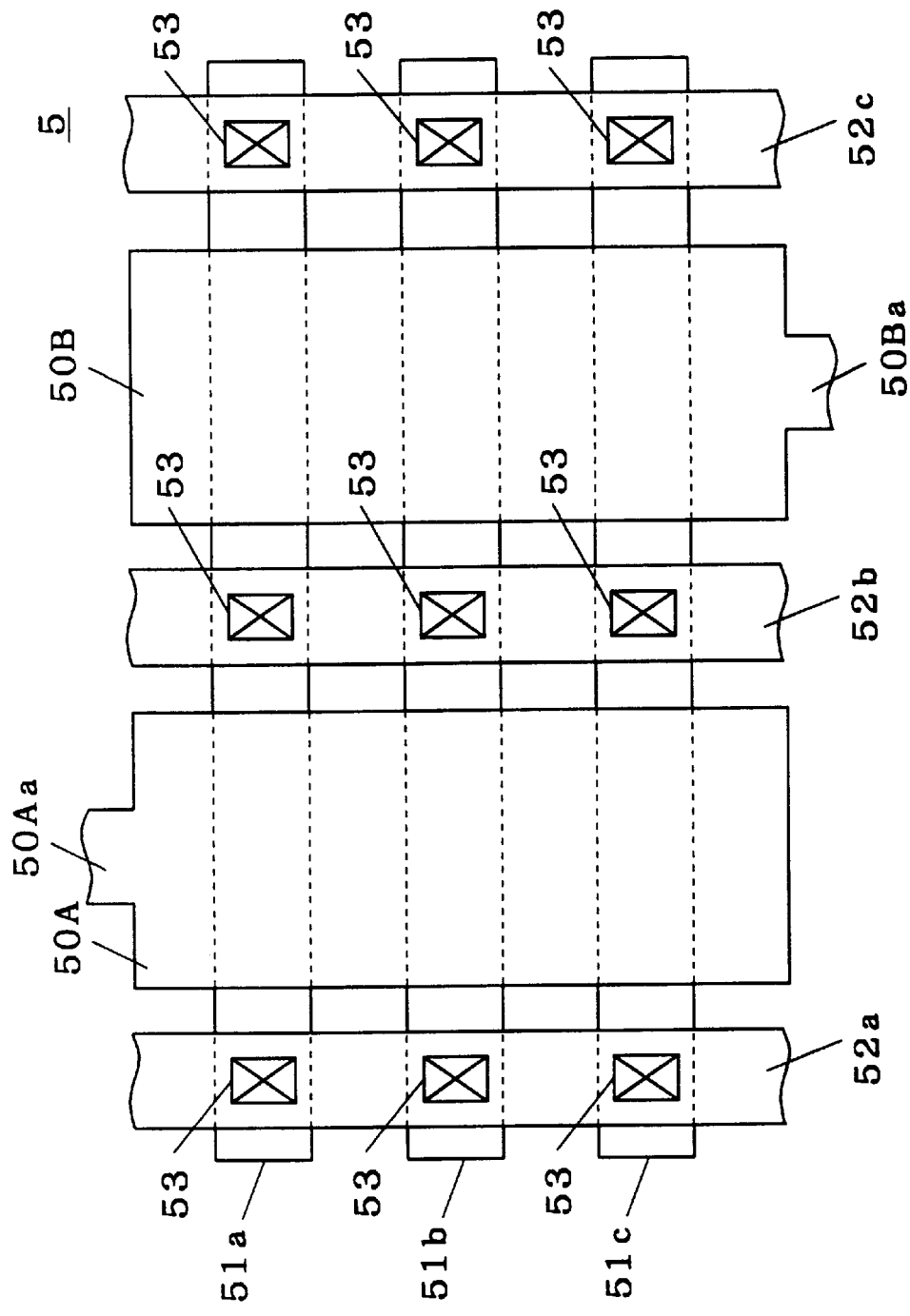
FIG. 9 illustrates a layout of a test structure for estimating defects at isolation edge in accordance with a fourth preferred embodiment of the present invention.

Referring next to FIG. 9, the test structure for estimating defects at the isolation edge in accordance with the fourth preferred embodiment of the present invention will be discussed. Gate electrodes 50A and 50B are provided on the field oxide film isolation 5 and regions of oxide film 51a to 51c are each contiguous with the field oxide film isolation 5 and thinner than the field oxide film isolation 5. Al wiring patterns 52a to 52c are provided on both sides of the gate electrodes 50A and 50B and contacts 53 serve to electrically connect the Al wiring patterns 52a to 52c to the wafer 1 below the regions 51a to 51c. Respective extensions 50Aa and 50Ba of the gate electrodes 50A and 50B are electrically connected to different Al pads provided on the field oxide film isolation 5 and not shown.

Given improvement in accuracy of measurement by virtue of the test structure for estimating defects at the isolation edge of the first preferred embodiment, errors of measurement due to other factors become conspicuous. In the test structure for estimating defects at the isolation edge of the fourth preferred embodiment, the contacts 53 are provided near the gate electrodes 50A and 50B to uniform the potential distribution of the wafer 1 in the vicinity of the gate electrodes 50A and 50B. Even if the gate insulation film is divided into a plurality of regions, the generation currents at the respective regions are uniform and accordingly variation in values of measurement decreases, thus improving the accuracy of measurement. Furthermore, evaluation is conducted on portions where the regions 51a to 51c and the gate electrodes 50A and 50B are overlapped. Moreover, providing the contacts 53 near the gate electrodes 50A and 50B reduces ill effect of resistance between the gate electrodes 50A and 50B. That ensures improvement in accuracy of measurement.

Figure 10:
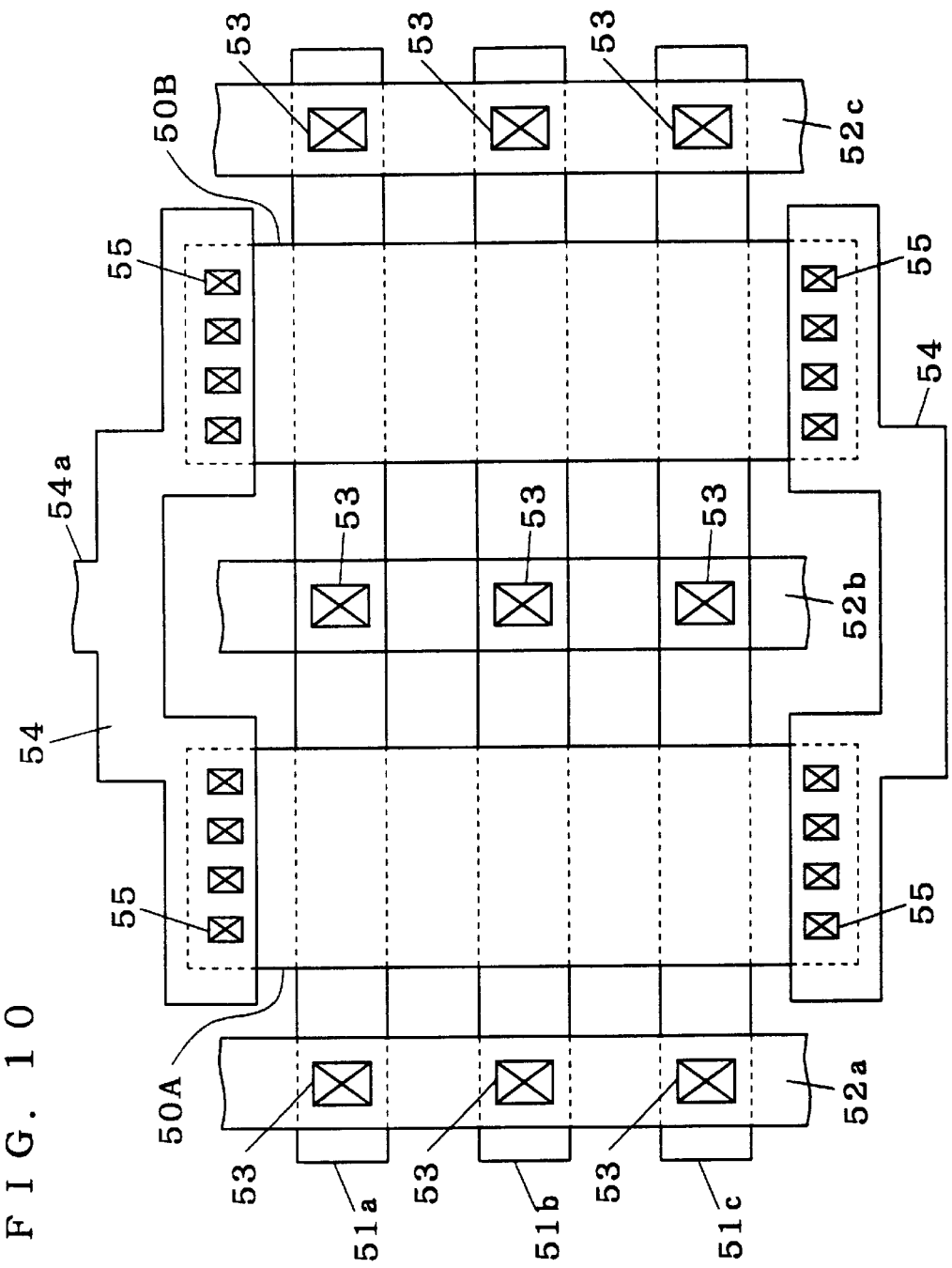
FIG. 10 illustrates a layout of a test structure for estimating defects at isolation edge in accordance with another aspect of the fourth preferred embodiment of the present invention.

Further, as shown in FIG. 10, a plurality of gate electrodes 50A and 50B are connected to each other with an Al wiring pattern 54 and the measured value thereby becomes larger, ensuring improvement in precision of evaluation. The Al wiring pattern 54 is connected to both the gate electrodes 50A and 50B with via contacts 55 and an extension 54a of the Al wiring pattern 54 is electrically connected to an Al pad provided on the field oxide film isolation S and not shown.

With the contacts 53 provided near the gate electrodes 50A and 50B, this configuration in which the potential distribution inside the gate electrode is uniform allows more accurate measurement than that in which the gate electrode simply has a larger area.

The isolation structure is not limited to the field oxide film though discussion has been made on the field oxide film serving as the isolation structure in the above preferred embodiments. As to the gate insulation film between the field oxide film isolation structures, other than the oxide film, being capable of isolating the gate electrode from the semiconductor substrate (wafer), may be used to produce the same effect.

While the invention has been shown and described in detail, the foregoing description is in all aspects illustrative and not restrictive. It is therefore understood that numerous modifications and variations can be devised without departing from the scope of the invention.

We claim:

1. A semiconductor test structure for estimating defects at an isolation edge, comprising:

a first insulation film provided on a main surface of a semiconductor substrate in which a plurality of semiconductor elements can be provided, said first insulation film having a width so as to isolate said plurality of semiconductor elements from one another;

a second insulation film provided on said main surface, said second insulation film including a plurality of regions spaced from one another and being contiguous with said first insulation film, thinner than said first insulation film, and having an edge which comprises at least a part of the isolation edge;

an electrode disposed in common on said plurality of regions of said second insulation film, said electrode extending onto portions of said first insulation film; and electrical connecting means connected with the semiconductor substrate so as to permit a voltage to be applied between the semiconductor substrate and the electrode.

2. A semiconductor test structure for estimating defects at an isolation edge, comprising:

a first insulation film provided on a main surface of a semiconductor substrate on which a plurality of semiconductor elements can be provided, said first insulation film having a width so as to isolate said plurality of semiconductor elements from one another;

a second insulation film provided on said main surface, said second insulation film includes a region whose plane at said main surface is S-shaped and is thinner than said first insulation film and has an edge which comprises at least a part of the isolation edge;

an electrode disposed on said second insulation film, said electrode extending onto portions of said first insulation film; and electrical connecting means connected with the semiconductor substrate so as to permit a voltage to be applied between the semiconductor substrate and the electrode.

3. A semiconductor test structure for estimating defects at an isolation edge, comprising:

a first insulation film provided on a main surface of a semiconductor substrate on which a plurality of semiconductor elements can be provided, said first insulation film having a width so as to isolate said plurality of semiconductor elements from one another;

a second insulation film provided on said main surface, said second insulation film including a plurality of regions spaced from one another and being contiguous with said first insulation film, thinner than said first insulation film, and having an edge which comprises at least a part of the isolation edge;

an electrode disposed on said second insulation film, said electrode extending onto portions of said first insulation film; and electrical connecting means connected with the semiconductor substrate so as to permit a voltage to be applied between the semiconductor substrate and the electrode, wherein said plurality of regions having plane surfaces at said main surface with different peripheral lengths at an interface with said first insulation film and a same area, said electrode includes a plurality of electrodes provided correspondingly to said plurality of regions of said second insulation film and electrically isolated from one another.

4. A semiconductor test structure for estimating defects at an isolation edge, comprising:

a first insulation film provided on a main surface of a semiconductor substrate on which a plurality of semiconductor elements can be provided, said first insulation film having a width so as to isolate said plurality of semiconductor elements from one another;

a second insulation film provided on said main surface, said second insulation film including a plurality of regions spaced from one another and being contiguous with said first insulation film, thinner than said first insulation film, and having an edge which comprises at least a part of the isolation edge;

an electrode disposed on said second insulation film, said electrode extending onto portions of said first insulation film; and electrical connecting means connected with the semiconductor substrate so as to permit a voltage to be applied between the semiconductor substrate and the electrode, wherein said plurality of regions having plane surfaces at said main surface with different peripheral lengths at an interface with said first insulation film and different areas, said electrode includes a plurality of electrodes provided correspondingly to said plurality of regions.

* * * * *